United States Patent [19]
Chung

[11] Patent Number: 6,137,324
[45] Date of Patent: Oct. 24, 2000

[54] PRECISION POWER-ON RESET CIRCUIT WITH IMPROVED ACCURACY

[75] Inventor: Michael S. C. Chung, San Jose, Calif.

[73] Assignee: Advanced Micro Devices, Inc., Sunnyvale, Calif.

[21] Appl. No.: 09/345,056

[22] Filed: Jun. 30, 1999

Related U.S. Application Data

[63] Continuation-in-part of application No. 09/088,828, Jun. 2, 1998.

[51] Int. Cl.$^7$ ........................................................ H03L 7/00
[52] U.S. Cl. ............................ 327/143; 327/198; 327/539
[58] Field of Search ..................................... 327/142, 143, 327/198, 539, 378, 541, 543, 433

[56] References Cited

U.S. PATENT DOCUMENTS

| | | | |
|---|---|---|---|
| 5,798,669 | 9/1999 | Klughart | 327/539 |
| 5,883,532 | 3/1999 | Bowers | 327/143 |
| 5,959,477 | 9/1999 | Chung | 327/143 |

*Primary Examiner*—Dinh T. Le
*Attorney, Agent, or Firm*—Monica H. Choi

[57] ABSTRACT

The present invention is a power-on reset circuit that generates a precise power-on reset pulse with an upper threshold voltage that is highly insensitive to variations in temperature and integrated circuit fabrication processes. The power-on reset circuit of the present invention includes a self-biased current generator capable of receiving a supply voltage and generating a first current, which is proportional to an absolute temperature, in response to receiving the supply voltage. The power-on reset circuit of the present invention also includes a base-emitter voltage detector that is coupled to the self-biased current generator such that a second current flowing though the base-emitter voltage detector is substantially equal to the first current generated by the self-biased current generator. Furthermore, the power-on reset circuit of the present invention includes a (BiCMOS) inverter that is coupled to the base-emitter voltage detector such that the BiCMOS inverter generates the power-on reset pulse as the supply voltage is turned on. With such a power-on reset circuit of the present invention, the upper threshold voltage of the power-on reset pulse may be optimized to be independent of the absolute temperature and to be insensitive to variations in the power supply voltage and in integrated circuit fabrication process parameters. In addition, the upper threshold voltage of the power-on reset pulse of the present invention is independent of a voltage across a drain and source of any MOSFET (Metal Oxide Semiconductor Field Effect Transistor) with the power-on reset circuit topology of the present invention.

6 Claims, 3 Drawing Sheets

PRECISION POWER-ON RESET CIRCUIT WITH IMPROVED ACCURACY

This is a continuation-in-part of an earlier filed patent application, with Ser. No. 09/088,828 filed on Jun. 2, 1998 U.S. Pat. No. 5,959,477, for which priority is claimed. This earlier filed patent application with Ser. No. 09/088,828 is in its entirety incorporated herewith by reference.

TECHNICAL FIELD

The present invention relates generally to power-on reset circuits, and more particularly, to a power-on reset circuit that is substantially independent of variations in temperature and integrated circuit fabrication processes.

BACKGROUND OF THE INVENTION

Figure 1:
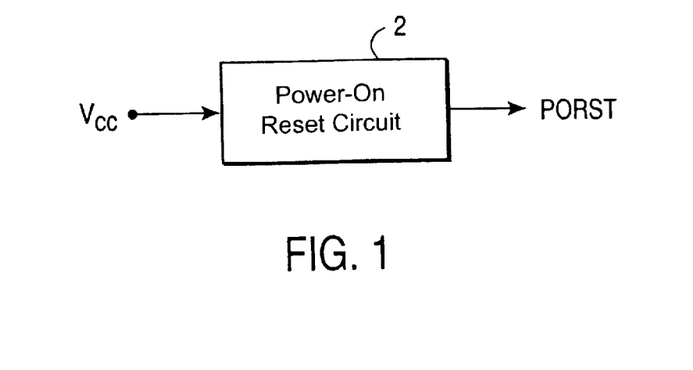
FIG. 1, described above, is a generic block diagram of a power-on reset circuit which outputs a power-on reset (PORST) pulse in response to an input power supply voltage $V_{cc}$.

Power-on reset circuits are usually required on various types of semiconductor integrated circuit chips to initialize various blocks of application circuit elements such as state machines and essential memory elements, for example, the memory gates of a non-volatile memory device. The semiconductor integrated circuit industry has developed various types of conventional power-on reset circuits for generating a power-on reset pulse in response to the application of a direct current (DC) common voltage $V_{cc}$ to the conventional power-on reset circuit. A typical conventional power-on reset circuit may be represented by a generic block diagram as shown in FIG. 1, with an input power supply voltage $V_{cc}$ applied to the conventional power-on reset circuit 2, which in response generates a power-on reset (PORST) pulse with a voltage roughly proportional to the input voltage $V_{cc}$ over a predetermined range of input power supply voltages.

When the integrated circuit is turned on, that is, when the supply voltage $V_{cc}$ increases from 0 V to a DC supply voltage $V_{cc}(DC)$, it is desirable that the voltage of the power-on reset pulse follow the supply voltage $V_{cc}$ exactly, up to a predetermined upper threshold voltage level $V_{cc}'$, which is a voltage slightly lower than the DC supply voltage $V_{cc}(DC)$. When the supply voltage $V_{cc}$ reaches above the upper threshold voltage $V_{cc}'$, it is desirable that the power-on reset pulse terminate exactly when it reaches the voltage level $V_{cc}'$. It is also desirable that the power-on reset pulse start as early as possible at a minimum turn-on voltage $V_{cc}°$ after the supply voltage $V_{cc}$ increases above the ground voltage 0 V. It is further desirable that the operating voltage range of the power-on reset pulse between the minimum turn-on voltage $V_{cc}°$ and the maximum pulse voltage $V_{cc}'$ be as insensitive to temperature and process variations as possible. However, the operating voltage ranges of power-on reset pulses generated by conventional power-on reset circuits are usually sensitive to variations due to the processing technology of semiconductor devices and to variations in operating temperatures.

In low voltage applications, the noise of the supply voltage $V_{cc}$ may be appreciable compared to the DC supply voltage $V_{cc}(DC)$. In this situation, the maximum pulse voltage $V_{cc}'$, which is the same as the upper threshold $V_{cc}'$ of the supply voltage $V_{cc}$, may be set at a voltage level slightly lower than the DC voltage $V_{cc}(DC)$ to take the noise voltage into the account. However, if the voltage $V_{cc}'$ at the end of the power-on reset pulse is too low, the application circuit which is to be reset by the power-on reset circuit may not be initialized properly. On the other hand, if the voltage $V_{cc}'$ is too close to the DC supply voltage $V_{cc}(DC)$, the voltage $V_{cc}'$ may shift to a voltage level higher than the DC supply voltage $V_{cc}(DC)$ due to the sensitivities of $V_{cc}'$ to temperature and process variations in a conventional power-on reset circuit. In either case, an application circuit to which the conventional power-on reset circuit is connected may not be able to function correctly because it is not properly initialized by the temperature and process sensitive power-on reset pulse generated by the conventional power-on reset circuit.

Therefore, there is a need for a power-on reset circuit that is able to generate a power-on reset pulse with an upper threshold voltage $V_{cc}'$ that is highly insensitive to temperature and process variations, particularly in situations in which the power-on reset circuit is implemented for generating power-on reset pulses in low voltage applications.

SUMMARY OF THE INVENTION

Accordingly, the present invention is a power-on reset circuit that generates a precise power-on reset pulse with an upper threshold voltage $V_{cc}'$ that is highly insensitive to variations in temperature and integrated circuit fabrication processes.

The power-on reset circuit of the present invention includes a self-biased current generator capable of receiving a supply voltage and generating a first current, which is proportional to an absolute temperature, in response to receiving the supply voltage. The power-on reset circuit of the present invention also includes a base-emitter voltage detector that further includes a voltage detector BJT (Bipolar Junction Transistor) having a base coupled to the self-biased current generator such that a second current flowing though the voltage detector BJT is substantially equal to the first current generated by the self-biased current generator. The base-emitter voltage detector also includes a first voltage detector resistor coupled between a collector of the voltage detector BJT and the supply voltage and includes a second voltage detector resistor coupled between the collector of the voltage detector BJT and ground. Furthermore, the power-on reset circuit of the present invention includes a bipolar complementary metal oxide semiconductor (BiCMOS) inverter including an inverter BJT (Bipolar Junction Transistor) having a base coupled to the collector of the voltage detector BJT and having a collector that generates the power-on reset pulse as the supply voltage is turned on. With such a power-on reset circuit of the present invention, the upper threshold voltage of the power-on reset pulse is proportional to the absolute temperature and proportional to a base to emitter voltage ($V_{BE}$) of the inverter BJT when the inverter BJT is turned on. Furthermore, the upper threshold voltage of the power-on reset pulse of the present invention is independent of a voltage across a drain and source of any MOSFET (Metal Oxide Semiconductor Field Effect Transistor) within the power-on reset circuit topology of the present invention. In addition, the present invention may be used to particular advantage when the upper threshold voltage of the power-on reset pulse is optimized to be insensitive to the absolute temperature.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, and 5 refer to elements having similar structure and function.

DETAILED DESCRIPTION

The present invention provides a precision power-on reset circuit which is capable of generating a power-on reset pulse in response to the turning on of a power supply voltage over a predetermined operating voltage range that is highly insensitive to temperature and process variations. Moreover, the power-on reset circuit according to the present invention is capable of generating a power-on reset pulse with a sufficiently long duration even if the power-on ramp is very steep, that is, if the supply voltage increases very rapidly from the ground voltage to the direct current (DC) common supply voltage during the turning on of the power-on reset circuit.

Figure 2:
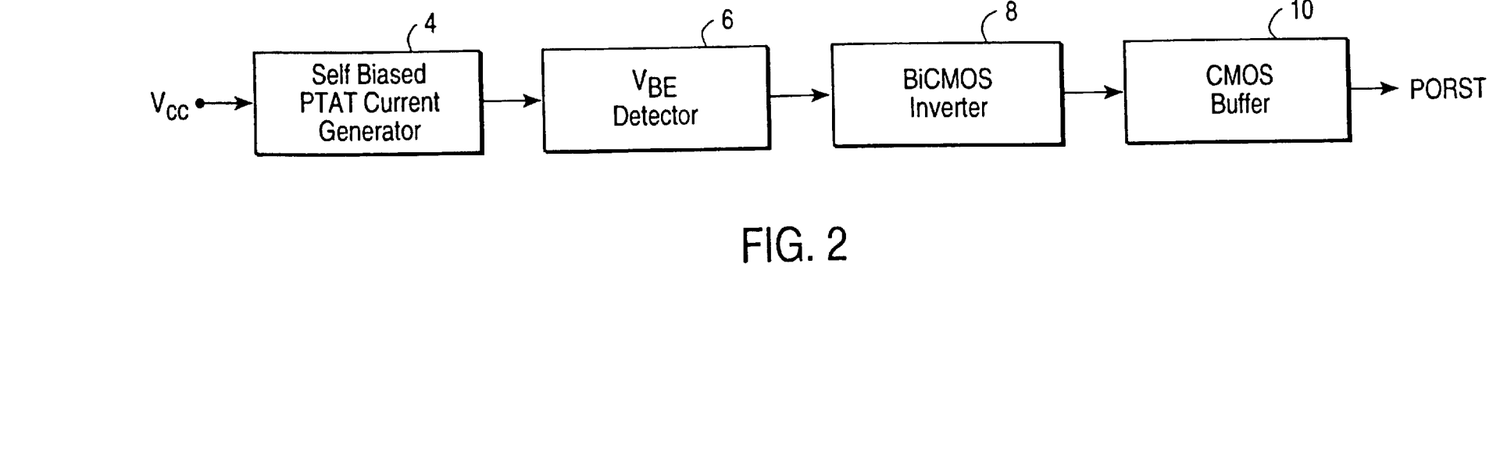
FIG. 2 is a block diagram of a power-on reset circuit in accordance with the present invention.

FIG. 2 is a block diagram showing the generic circuit blocks of the power-on reset circuit in accordance with the present invention. The power-on reset circuit generally comprises a self-biased proportional-to-absolute-temperature (PTAT) current generator 4 which is coupled to receive a supply voltage $V_{cc}$, a base-emitter voltage ($V_{BE}$) detector 6 coupled to the self-biased PTAT current generator 4, a bipolar complementary metal oxide semiconductor (BiCMOS) inverter 8 coupled to the base-emitter voltage detector 6, and a complementary metal oxide semiconductor (CMOS) buffer 10, which is coupled to the BiCMOS inverter 8 for generating the power-on reset pulse (PORST). The self-biased PTAT current generator 4 is capable of receiving the supply voltage $V_{cc}$, which increases from 0 V to the common DC voltage $V_{cc}(DC)$ when power supply for the power-on reset circuit is turned on. In response to receiving the supply voltage $V_{cc}$, the self-biased current generator 4 generates a current $I_{PTAT}$, which is a current proportional to the absolute temperature in the self-biased current generator 4.

The base-emitter voltage detector 6, which is coupled to the self-biased PTAT current generator 4, generates a current which is a mirror image of the current $I_{PTAT}$ in the self-biased current generator 4. The BiCMOS inverter 8, which is coupled to the base-emitter voltage detector 6, is capable of generating a power-on reset (PORST) pulse having a voltage that is proportional to the supply voltage $V_{cc}$ up to a predetermined upper-threshold voltage $V_{cc}'$. In order for an application circuit to be reset by the power-on reset pulse generated by the power-on reset circuit according to the present invention, the CMOS buffer 10 is coupled to the BiCMOS inverter 8 to isolate the current $I_{PTAT}$ from the application circuit (not shown) which receives the power-on reset (PORST) pulse.

Figure 3:
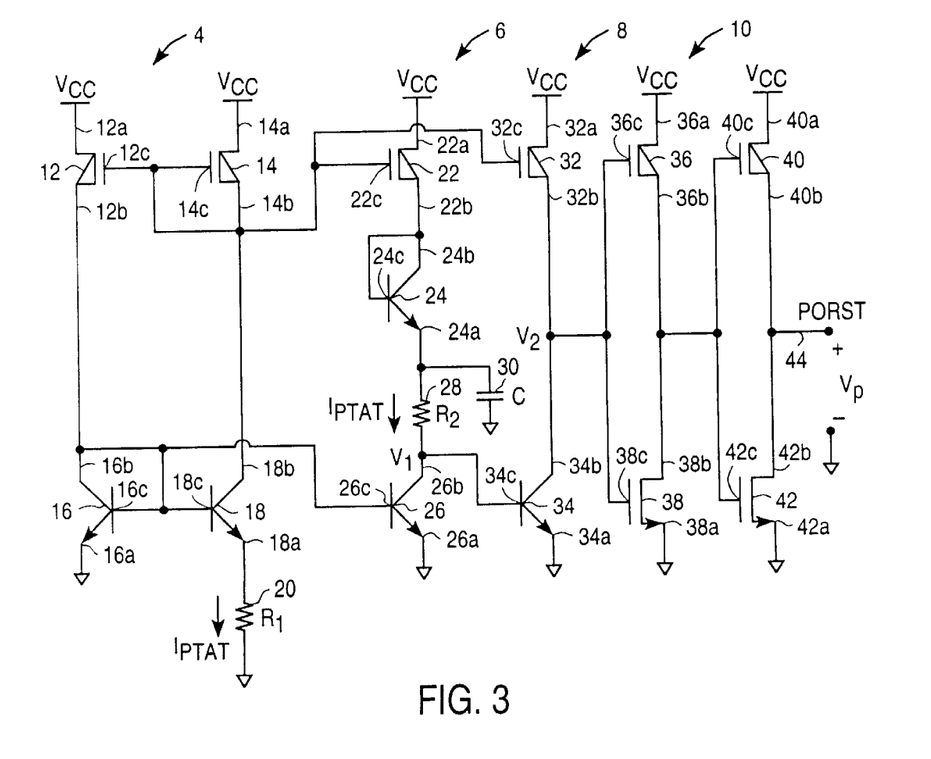
FIG. 3 is a detailed circuit diagram of an embodiment of the power-on reset circuit in accordance with the present invention.

FIG. 3 is a detailed circuit diagram showing an embodiment of the power-on reset circuit of FIG. 2 according to the present invention. In this embodiment, the self-biased PTAT current generator 4 comprises a first p-channel metal oxide semiconductor (PMOS) transistor 12, a second PMOS transistor 14, a first npn bipolar transistor 16 and a second npn bipolar transistor 18. The source 12a of the first PMOS transistor 12 and the source 14a of the second PMOS transistor 14 are connected to receive the power supply voltage $V_{cc}$. The gate 14c of the second PMOS transistor 14 is connected to the gate 12c of the first PMOS transistor 12, and is further connected to the drain 14b of the second PMOS transistor 14.

The collector 16b of the first npn bipolar transistor 16 is connected to the drain 12b of the first PMOS transistor 12, and is further connected to the base 16c of the first npn bipolar transistor 16. The emitter 16a of the first npn bipolar transistor 16 is connected to ground.

The collector 18b of the second npn bipolar transistor 18 is connected to the drain 14b of the second PMOS transistor 14, and the base 18c of the second npn bipolar transistor 18 is connected to the base 16c of the first npn bipolar transistor 16.

The self-biased PTAT current generator 4 further comprises a first resistor 20 with a resistance value $R_1$ coupled to the emitter 18a of the second npn bipolar transistor 18. The first resistor 20 has one end connected to the emitter 18a of the second npn bipolar transistor 18 and a second end which is connected to ground. In response to receiving the supply voltage $V_{cc}$ by the sources 12a and 14a of the first and second PMOS transistors 12 and 14, respectively, the self-biased PTAT current generator 4 produces a current $I_{PTAT}$ which is proportional to the absolute temperature of the self-biased current generator 4 at the emitter 18a of the second npn bipolar transistor 18. The current $I_{PTAT}$ is a positive current which flows from the emitter 18a of the second npn bipolar transistor 18 to ground through the first resistor 20.

Furthermore, the base-emitter voltage ($V_{BE}$) detector 6 in the power-on reset circuit according to the present invention comprises a third PMOS transistor 22, a third npn bipolar transistor 24 and a fourth npn bipolar transistor 26. The source 22a of the third PMOS transistor 22 is connected to receive the supply voltage $V_{cc}$, and the gate 22c of the third PMOS transistor 22 is connected to the gates 12c and 14c of the first and second PMOS transistors 12 and 14, respectively. The collector 24b of the third npn bipolar transistor 24 is connected to the drain 22b of the third PMOS transistor 22, and is further connected to the base 24c of the third npn bipolar transistor 24. The base 26c of the fourth npn bipolar transistor 26 is connected to the bases 16c and 18c of the first and second npn bipolar transistors 16 and 18, respectively. The emitter 26a of the fourth npn bipolar transistor 26 is connected to ground.

The base-emitter voltage detector 6 further comprises a second resistor 28 with a resistance value $R_2$, which is connected between the emitter 24a of the third npn bipolar transistor 24 and the collector 26b of the fourth npn bipolar transistor 26. The second resistor 28 and the first resistor 20 may be made of the same type of materials using the same processing technology such that the ratio of the resistances of the first and second resistors 20 and 28 is insensitive to temperature and process variations. A current with a value of $I_{PTAT}$, which is a mirror image of the current that flows through the first resistor 20 in the self-biased PTAT current generator 4, flows from the emitter 24a of the third npn bipolar transistor 24 to the collector 26b of the fourth npn bipolar transistor 26 through the second resistor 28.

Furthermore, in order for the power-on reset circuit to generate a power-on reset pulse with a sufficiently long pulse duration in a situation in which the power-on ramp of the supply voltage $V_{cc}$ is very steep during the turning on of the power-on reset circuit, a capacitor 30 is coupled to the emitter 24a of the third npn bipolar transistor 24. The capacitor 30 has one end which is connected to the emitter 24a of the third npn bipolar transistor 24 and a second end which is connected to ground.

In accordance with the present invention, the BiCMOS inverter 8 comprises a fourth PMOS transistor 32 and a fifth npn bipolar transistor 34. The source 32a of the PMOS transistor 32 is connected to receive the supply voltage $V_{cc}$, and the gate 32c of the fourth PMOS transistor 32 is connected to the gates 12c, 14c and 22c of the first, second and third PMOS transistors 12, 14 and 22, respectively. The collector 34b of the fifth npn bipolar transistor 34 is connected to the drain 32b of the fourth PMOS transistor 32. The base 34c of the fifth npn bipolar transistor 34 is connected to the collector 26b of the fourth npn bipolar transistor 26 in the base-emitter voltage detector 6. The emitter 34a of the fifth npn bipolar transistor 34 is connected to ground.

In a further embodiment, the power-on reset circuit according to the present invention further comprises a CMOS buffer 10 which is coupled to the BiCMOS inverter 8 to output the power-on reset pulse and to isolate the application circuit (not shown) to which the power-on reset circuit according to the present invention is connected from the currents in the power-on reset circuit. The CMOS buffer 10 comprises at least one pair of PMOS and NMOS transistors including a fifth PMOS transistor 36 and an n-channel metal oxide semiconductor (NMOS) transistor 38. The source 36a of the fifth PMOS transistor 36 is connected to receive the supply voltage $V_{cc}$, whereas the source 38a of the first NMOS transistor 38 is connected to ground. The drain 36b of the fifth PMOS transistor 36 is connected to the drain 38b of the first NMOS transistor 38, and the gate 36c of the fifth PMOS transistor 36 is connected to the gate 38c of the first NMOS transistor 38. Furthermore, the gates 36c and 38c of the fifth PMOS transistor 36 and the first NMOS transistor 38, which are connected together, are connected to the collector 34b of the fifth npn bipolar transistor 34 and the drain 32b of the fourth PMOS transistor 32, which are connected together in the BiCMOS inverter 8.

In order for the voltage $V_p$ of the output power-on reset (PORST) pulse to have a non-inverted positive voltage waveform, the CMOS buffer 10 further includes an additional pair of PMOS and NMOS transistors comprising a sixth PMOS transistor 40 and a second NMOS transistor 42. The source 40a of the sixth PMOS transistor 40 is connected to receive the supply voltage $V_{cc}$ and the source 42a of the second NMOS transistor 42 is connected to ground. The drain 40b of the sixth PMOS transistor 40 is connected to the drain 42b of the second NMOS transistor 42, and the gate 40c of the sixth PMOS transistor 40 is connected to the gate 42c of the second NMOS transistor 42. The gates 40c and 42c of the sixth PMOS transistor 40 and the second NMOS transistor 42, which are connected together, are connected to the drains 36b and 38b of the fifth PMOS transistor 36 and the first NMOS transistor 38, which are connected together. The drains 40b and 42b of the sixth PMOS transistor 40 and the second NMOS transistor 42, which are connected together, are connected to a power-on reset (PORST) output terminal 44 for outputting the PORST pulse signal with a positive pulse voltage $V_p$. An application circuit such as a state machine or a memory circuit may be connected to the PORST output 44 to receive the power-on reset pulse, which resets the application circuit during the turning on of the power supply.

In yet a further embodiment, additional pairs of PMOS and NMOS transistors may be cascaded together in the CMOS buffer 10 to provide further isolation for the PORST output 44 from the currents within the power-on reset circuit. In order for the output PORST signal to have a positive non-inverted voltage waveform, it is desirable that an even number of pairs of PMOS and NMOS transistors be included in the CMOS buffer 10.

In a further embodiment, the first, second and third PMOS transistors 12, 14 and 22 have the same shape factor, defined as the ratio of channel width to channel length (W/L), which is a physical characteristic of a MOS transistor known to a person skilled in the art, whereas the fourth PMOS transistor 32 has a shape factor different from that of the first, second and third PMOS transistors 12, 14 and 22. For example, the shape factor W/L of the fourth PMOS transistor 32 may be roughly one-quarter of that of each of the first, second and third PMOS transistors 12, 14 and 22. The shape factors of the PMOS transistors 36 and 40 and of the NMOS transistors 38 and 42 in the CMOS buffer 10 may be the same as or different from the shape factor (W/L) of the first, second and third PMOS transistors 12, 14 and 22, and are thus not critical to the present invention.

In a further embodiment, the first, third, fourth and fifth npn bipolar transistors 16, 24, 26 and 34 have an equal emitter area whereas the second npn bipolar transistor 18 has an emitter area different from that of each of the first, third, fourth and fifth npn bipolar transistors 16, 24, 26 and 34. The first, third, fourth and fifth transistors 16, 24, 26 and 34 each have a unit-size emitter area while the emitter area of the second npn bipolar transistor 18 is A times the unit-size emitter area of each of the first, third, fourth and fifth npn bipolar transistors 16, 24, 26 and 34. As discussed below, the size factor A for the emitter area of the second npn bipolar transistor 18 is an important parameter in the design of the power-on reset circuit according to the present invention.

Figure 4:
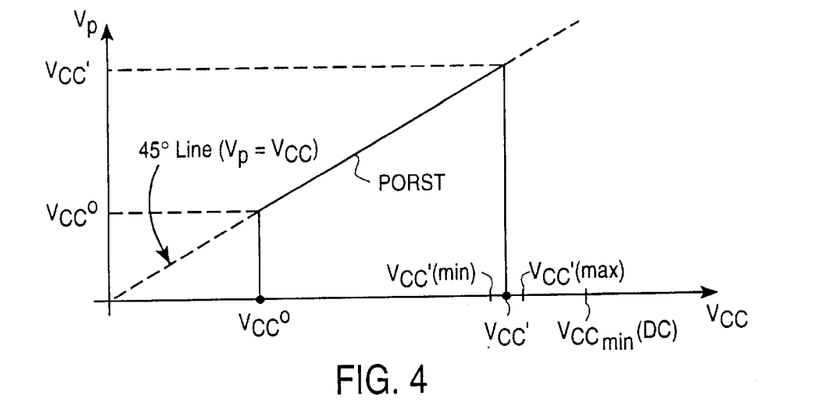
FIG. 4 shows a typical transfer characteristic of the power-on reset (PORST) pulse voltage $V_p$ versus the power supply voltage $V_{cc}$ for the power-on reset circuit in accordance with the present invention.

FIG. 4 shows a typical transfer characteristic of the voltage $V_p$ of the power-on reset (PORST) pulse versus the power supply voltage $V_{cc}$, which is the common input power voltage for the power-on reset circuit according to the present invention.

As shown in FIG. 4, the PORST pulse is generated when the supply voltage $V_{cc}$ is in the range of $V_{cc}°$ to $V_{cc}'$. The PORST pulse begins when the supply voltage $V_{cc}$ reaches the lower threshold voltage $V_{cc}°$, and increases linearly with the supply voltage $V_{cc}$ until the supply voltage $V_{cc}$ reaches the upper threshold voltage $V_{cc}'$, the point at which the PORST pulse ends and the output voltage $V_p$ of the power-on reset circuit drops to 0 V. The power supply voltage $V_{cc}$ increases further from the upper threshold voltage $V_{cc}'$ to the DC power supply voltage $V_{cc}(DC)$, which is the operating DC voltage for the application circuit connected to receive the PORST pulse generated by the power-on reset circuit.

The lowest threshold voltage $V_{cc}°$ should be as low as possible such that the relevant circuit elements in the application circuit can be initialized by the PORST pulse as early as possible during the turning on of the power supply voltage $V_{cc}$. In the power-on reset circuit according to the present invention, the lower threshold voltage $V_{cc}°$ is typically in the range of about 1.2 V to 1.4 V for a DC supply voltage $V_{cc}(DC)$ on the order of about 3 V, and is acceptably close to the ground voltage in many low voltage applications. Although the lower threshold voltage $V_{cc}°$ is ideally set at 0

V, in practice it is limited by the turn-on voltage of a PMOS transistor which is typically in the range of about 0.8 V to 1.0 V.

The upper threshold voltage $V_{cc}'$ should satisfy the following two-sided relationship:

$$V_{cc}'(\min) \leq V_{cc}' \leq V_{cc}'(\max) \tag{1}$$

wherein $V_{cc}'(\min)$ is the minimum value of the supply voltage $V_{cc}$ required for the relevant circuit elements to function correctly for proper initialization. The maximum upper threshold voltage $V_{cc}'(\max)$ can be determined by the following relationship:

$$V_{cc}'(\max) = V_{ccmin}(DC) - \Delta_{noise} \tag{2}$$

wherein $V_{ccmin}(DC)$ is the minimum value of the DC supply voltage for maintaining normal operation of the application circuit and $\Delta_{noise}$ is a noise margin parameter, which can be estimated or measured by a person skilled in the art.

In order to achieve a tight control on the spread in the upper threshold voltage $V_{cc}'$ over temperature and process variations in low voltage applications in which the difference between the voltage $V_{cc}'(\max)$ and the voltage $V_{cc}'(\min)$ is typically small, the power-on reset circuit according to the present invention is able to generate a PORST pulse with an upper threshold voltage $V_{cc}'$ that is highly insensitive to temperature and process variations by selecting the proper values of the size factor A for the emitter area of the second npn bipolar transistor 18 and the resistances $R_1$ and $R_2$ of the first and second resistors 20 and 28, respectively, as discussed below. In the self-biased PTAT current generator 4, for a sufficiently large value of $V_{cc}$, the current $I_{PTAT}$, which is the current flowing from the emitter 18a of the second npn bipolar transistor 18 through the first resistor 20, is approximately given by the relationship:

$$I_{PTAT} = \frac{V_{BE}(16) - V_{BE}(18)}{R_1} \tag{3}$$
$$= \frac{kT \ln(A)}{qR_1}$$

wherein $V_{BE}(16)$ and $V_{BE}(18)$ are the base-emitter voltages of the first and second npn bipolar transistors 16 and 18, respectively. The size factor A for the second npn bipolar transistor 18 is the ratio of the emitter area of the second npn bipolar transistor 18 to the emitter area of the first npn bipolar transistor 16. In Equation (3), q is the electronic charge, k is Boltzmann's constant, T is the absolute temperature of the self-biased PTAT current generator 4, and $R_1$ is the resistance value of the first resistor 20. It is apparent from Equation (3) that the size factor A for the emitter area of the second npn bipolar transistor 18 should be other than one in order to have a non-zero current $I_{PTAT}$ to flow through the first resistor 20. It is further apparent from Equation (3) that the emitter area of the second npn bipolar transistor 18 should be larger than that of the first npn bipolar transistor 16 such that the current $I_{PTAT}$ flowing from the emitter 18a of the second npn bipolar transistor 18 to the first resistor 20 is a positive current.

Assuming that the supply voltage $V_{cc}$ is ramped up from the ground voltage of 0 V during the turning on of the power supply, the current $I_{PTAT}$ begins to flow through the first resistor 20 as soon as the supply voltage $V_{cc}$ reaches the lower threshold voltage $V_{cc}^\circ$. As the supply voltage $V_{cc}$ increases beyond the lower threshold voltage $V_{cc}^\circ$, the voltage $V_p$ of the output PORST pulse follows the input supply voltage $V_{cc}$ linearly until the supply voltage $V_{cc}$ reaches the upper threshold voltage $V_{cc}'$. As shown in FIG. 4, the PORST pulse voltage $V_p$ is equal to the supply voltage $V_{cc}$ when $V_{cc}$ is in the range of $V_{cc}^\circ$ to $V_{cc}'$, as illustrated by the 45° line segment from $V_{cc}^\circ$ to $V_{cc}'$.

Referring back to FIG. 3, the current $I_{PTAT}$, which is proportional to the absolute temperature T in the self-biased current generator 4 according to Equation (3) above, is reproduced as a mirror image current $I_{PTAT}$ through the second resistor 28 in the base-emitter voltage detector 6. The current $I_{PTAT}$ thus flows through the third PMOS transistor 22, the third npn bipolar transistor 24, the second resistor 28, and the fourth npn bipolar transistor 26. In a quasi-DC circuit analysis, no current flows through the capacitor 30, which is connected to the emitter 24a of the third npn bipolar transistor 24. The third PMOS transistor 22 has the same shape factor W/L as that of the first and second PMOS transistors 12 and 14, while the third and fourth npn bipolar transistors 24 and 26 each have an emitter area equal to that of the first npn bipolar transistor 16. The voltage across the base-emitter voltage detector 6, which is a voltage at the source 22a of the third PMOS transistor 22 relative to the ground voltage at the emitter 26a of the fourth npn bipolar transistor 26, is summed according to the following relationship:

$$V_{cc} = \Delta + V_{BE}(24) + I_{PTAT} \cdot R_2 + V_1 \tag{4}$$

wherein $\Delta$ is the drain-to-source voltage across the third PMOS transistor 22, $V_{BE}(24)$ is the base-emitter voltage of the third npn bipolar transistor 24, and $V_1$ is the voltage at the collector 26b of the fourth npn bipolar transistor 26 with respect to ground. During the initial ramp-up of the supply voltage $V_{cc}$, $V_1$ is small and is not sufficient to turn on the fifth npn bipolar transistor 34 in the BiCMOS inverter 8 for small values of $V_{cc}$. The voltage at the collector 34b of the fifth npn bipolar transistor 34 and the drain 32b of the PMOS transistor 32, which are connected together, is thus driven to the supply voltage $V_{cc}$ by the fourth PMOS transistor 32 through current mirroring action. The output voltage of the PORST pulse will thus follow the supply voltage $V_{cc}$ for small values of $V_{cc}$ greater than $V_{cc}^\circ$.

When the supply voltage $V_{cc}$ reaches a sufficiently large value such that the voltage $V_1$ reaches the base-emitter turn-on voltage $V_{BE}(34)$ at the fifth npn bipolar transistor 34, the voltage $V_1$ causes the fifth npn bipolar transistor 34 to turn on and to pull the voltage $V_2$ at the collector 34b of the fifth npn bipolar transistor 34 to the ground voltage. Solving for the value of $V_{cc}$ at which $V_1$ reaches $V_{BE}(34)$ by using Equation (4), the following relationship is obtained:

$$V_{cc}' = \Delta' + V_{BE}(24) + I_{PTAT} \cdot R_2 + V_{BE}(34) \tag{5}$$

Since the third and fifth npn bipolar transistors 24 and 34 have an identical emitter area, the base-emitter turn-on voltages $V_{BE}(24)$ and $V_{BE}(34)$ are the same, and can thus be denoted as $V_{BE}$. Furthermore, by substituting the term $I_{PTAT}$ in Equation (5) by Equation (3), the following relationship is obtained:

$$V'_{cc} \cong \Delta' + 2V_{BE} + \left(\frac{R_2}{R_1}\right) \cdot \ln(A) \cdot \frac{kT}{q} \qquad (6)$$

The term $\Delta'$ in Equation (6) above is the drain-to-source voltage $V_{DS}$ for the third PMOS transistor 22, and is relatively insensitive to variations in the supply voltage $V_{cc}$. Although the voltage $V_{DS}$ for a PMOS transistor is dependent on the processing technology to some degree, in practice the voltage $\Delta'$ is a small voltage on the order of about 0.1 V. Compared to the other two terms in Equation (6), the effect of $\Delta'$ on the upper threshold voltage $V_{cc}'$ is relatively small.

Assuming that $\Delta'$ is insensitive to $V_{cc}$, it is apparent from Equation (6) that the upper threshold voltage $V_{cc}'$ is only a function of $V_{BE}$, T and $R_2/R_1$. Since it is known to a person skilled in the art that the base-emitter turn-on voltage $V_{BE}$ of a bipolar junction transistor, which is typically in the range of about 0.6 V to 0.7 V, is relatively insensitive to process variations, that the ratio of two resistors of the same type produced by the same processing technology on an integrated circuit is highly process and temperature insensitive, and that the size factor A, which is the ratio of the emitter area of the second npn bipolar transistor 18 to the emitter area of the first npn bipolar transistor 16, is also highly process insensitive, it follows that the upper threshold voltage $V_{cc}'$ is relatively process insensitive.

Further assuming that $\Delta'$ is insensitive to process and temperature variations and is therefore constant with respect to temperature, by taking the partial derivative of Equation (6) with respect to the temperature, the following relationship is obtained:

$$\frac{\partial V'_{cc}}{\partial T} \cong 2\frac{\partial V_{BE}}{\partial T} + k\left(\frac{R_2}{R_1}\right) \cdot \frac{\ln(A)}{q} \qquad (7)$$

Since it is known to a person skilled in the art that the base-emitter voltage $V_{BE}$ has a negative temperature coefficient, which is typically on the order of about $-2$ mV/° C. for a typical npn bipolar junction transistor, it follows that the partial derivative of $V_{BE}$ with respect to the temperature is less than zero. Hence, in Equation (7), the upper threshold voltage $V_{cc}'$ can be temperature compensated because $$\frac{k}{q}\left(\frac{R_2}{R_1}\right)\ln(A) > 0 \qquad (8)$$

such that the derivative of $V_{cc}'$ with respect to the temperature is the sum of a positive and a negative number. By adjusting the ratio $R_2/R_1$ and the size factor A for the emitter area of the second npn bipolar transistor 18, the partial derivative $V_{cc}'$ with respect to the temperature can be made to approximately equal zero at a suitable value of $V_{cc}'$.

Referring back to Equation (6), the term $\Delta'$, which is relatively process and temperature insensitive, is negligibly small. The term $2V_{BE}$ is a significant term which typically has a value in the range of about 1.2 V to 1.4 V but in practice is relatively insensitive to the processing technology. As an illustrative example, by using a value of 0.65 V for the base-emitter voltage $V_{BE}$, a value of 13 for the ratio $R_2/R_1$, and a value of 12 for the emitter size factor A, and assuming that the power-on reset circuit operates at a temperature of 322° K, and further assuming that $\Delta'$ equals 0.1 V, the resulting upper threshold voltage $V_{cc}'$ is approximately 2.3 V, which in practice should be acceptable for an application circuit operating with a minimum DC supply voltage $V_{ccmin}$(DC) in the range of about 2.7 V to 3.0 V.

Based upon circuit simulations, it is found that the upper threshold voltage $V_{cc}'$ varies by approximately ±5% over a temperature range of 0° C. to 80° C. (273° K to 353° K) and over a wide range of process variations. Therefore, in the operating example described above, the typical upper threshold voltage $V_{cc}'$ is set at 2.3 V and varies from 2.19 V to 2.42 V over wide process and temperature variations. In practice, this variation in $V_{cc}'$ is quite acceptable for a DC supply voltage $V_{cc}$(DC) with a value of 3.0 V ±10%. It is also found that the lower threshold voltage $V_{cc}°$ is in the range of about 1.2 V to 1.4 V, which is quite acceptable in many practical applications in which the DC supply voltage is on the order of about 3 V.

Furthermore, the capacitor 30 may be provided in the base-emitter voltage detector 6 as shown in FIG. 3 to assure a PORST pulse of at least a sufficiently long duration to reset the application circuit if the on-ramp of the power supply voltage $V_{cc}$ is very steep, that is, if the supply voltage $V_{cc}$ is turned on very rapidly from 0 V to $V_{cc}$(DC). The duration of the PORST pulse can be approximated by the time constant $\tau$ which is equal to $R_2C$. Selection of the time constant $\tau$ depends on the duration of the PORST pulse required for resetting the application circuit to which the power-on reset circuit according to the present invention is connected during the turning on of the power supply voltage $V_{cc}$. For example, the time constant $\tau$ may be on the order of a few microseconds for resetting a conventional memory circuit, and the capacitance value C of the capacitor 30 may be selected based on the time constant $\tau$ and the resistance value $R_2$ of the second resistor 28 in the base-emitter voltage detector 6.

INDUSTRIAL APPLICABILITY

The precision power-on reset circuit according to the present invention is applicable for the power-on reset of a variety of integrated circuits, such as state machines and memory devices including non-volatile memory devices. The power-on reset circuit according to the present invention generates a power-on reset pulse that is highly insensitive to variations in the operating temperature and variations due to the processing technology. The power-on reset circuit according to the present invention may be implemented with the application circuit on the same semiconductor chip. Alternatively, the power-on reset circuit according to the present invention may be implemented on a semiconductor chip that is separate from the application circuit which receives the power-on reset pulse.

POWER-ON RESET CIRCUIT WITH IMPROVED ACCURACY

Figure 5:
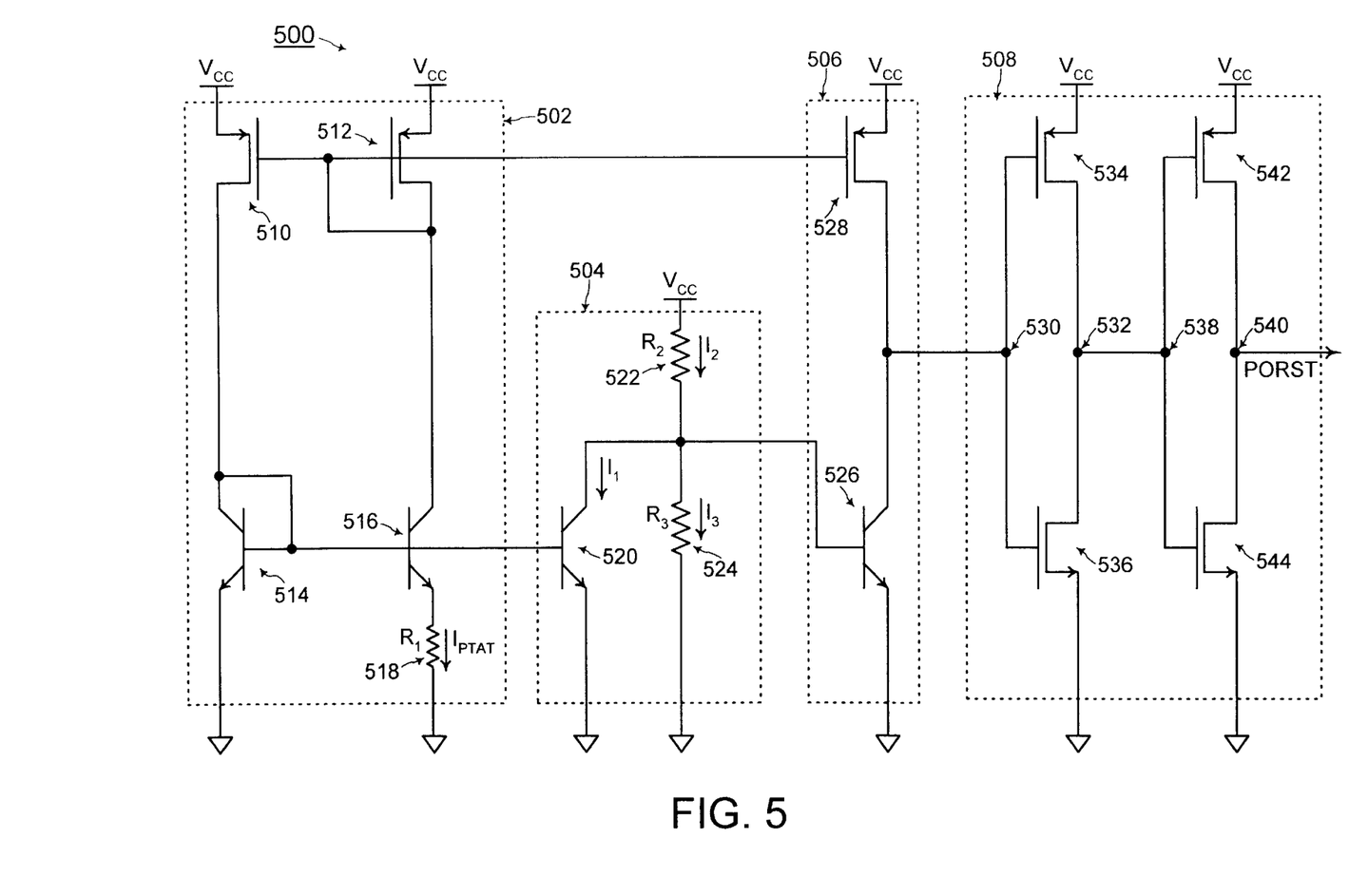
FIG. 5 shows a circuit diagram of another embodiment of a power-on reset circuit that provides a power-on reset (PORST) pulse with further insensitivity to variations in temperature and integrated circuit fabrication processes for improved accuracy, in accordance with the present invention.

In another embodiment of the present invention, an alternative circuit topology of a power-on reset circuit 500 of FIG. 5 provides a power-on reset pulse (PORST) with further insensitivity to variations in temperature and integrated circuit fabrication processes. Referring to FIGS. 2, 3, and 5, similar to the power-on reset circuit of FIG. 3, the power-on reset circuit 500 of FIG. 5 includes a self-biased PTAT current generator 502 (shown within dashed lines in FIG. 5), a base-emitter voltage detector 504 (shown within dashed lines in FIG. 5), a BiCMOS inverter 506 (shown within dashed lines in FIG. 5), and a CMOS buffer 508 (shown within dashed lines in FIG. 5).

The self-biased PTAT current generator 502 of FIG. 5 is similar to the self-biased PTAT current generator 4 of FIG.

3. The self-biased PTAT current generator 502 of FIG. 5 includes a first PMOSFET (P-channel Metal Oxide Semiconductor Field Effect Transistor) 510 having a source coupled to the supply voltage $V_{cc}$. A second PMOSFET (P-channel Metal Oxide Semiconductor Field Effect Transistor) 512 has a source also coupled to the supply voltage $V_{cc}$. The gate and the drain of the second PMOSFET 512 are coupled to each other, and the gate of the second PMOSFET 512 is coupled to the gate of the first PMOSFET 510.

The self-biased PTAT current generator 502 also includes a first current generator BJT (Bipolar Junction Transistor) 514. The emitter of the first current generator BJT is coupled to ground, and the collector of the first current generator BJT 514 is coupled to the base of the first current generator BJT 514 and to the drain of the first PMOSFET 510. In addition, the self-biased PTAT current generator 502 includes a second current generator BJT (Bipolar Junction Transistor) 516. The emitter of the second current generator BJT 516 is coupled to ground via a current generator resistor 518 having a resistance value $R_1$. The base of the second current generator BJT 516 is coupled to the base of the first current generator BJT 514, and the collector of the second current generator BJT 516 is coupled to the drain of the second PMOSFET 512.

The first current generator BJT 514 has a first emitter area, and the second current generator BJT 516 has a second emitter area. If the ratio of the second emitter area to the first emitter area is a size factor of "A," then a current generated through the current generator resistor 518 (and through the second current generator BJT 516), $I_{PTAT}$, is as follows:

$$I_{PTAT} = \frac{V_{BE}(514) - V_{BE}(516)}{R_1} \quad (9)$$
$$\frac{kT \ln(A)}{qR_1}$$

wherein $V_{BE}$(514) and $V_{BE}$(516) are the base-emitter voltages of the first current generator BJT 514 and of the second current generator BJT 516, respectively. In Equation (9), q is the electronic charge, k is Boltzmann's constant, and T is the absolute temperature of the self-biased PTAT current generator 502. It is apparent from Equation (9) that the size factor A should be other than one in order to have a non-zero current $I_{PTAT}$ to flow through the second current generator BJT 516.

The base-emitter voltage detector 504 of FIG. 5 includes a voltage detector BJT (Bipolar Junction Transistor) 520 having a base coupled to the base of the first current generator BJT 514 and to the base of the second current generator BJT 516. The emitter of the voltage detector BJT 520 is coupled to ground. The base-emitter voltage detector 504 further includes a first voltage detector resistor 522 coupled between the supply voltage $V_{cc}$ and the collector of the voltage detector BJT 520. The first voltage detector resistor 522 has a resistance value of $R_2$. The base-emitter voltage detector 504 further includes a second voltage detector resistor 524 coupled between ground and the collector of the voltage detector BJT 520. The second voltage detector resistor 524 has a resistance value of $R_3$.

The BiCMOS inverter 506 of FIG. 5 includes an inverter BJT (Bipolar Junction Transistor) 526 having a base coupled to the collector of the voltage detector BJT 520. The emitter of the inverter BJT 526 is coupled to ground, and the collector of the inverter BJT 526 is coupled to a drain of a biasing PMOSFET (P-channel Metal Oxide Semiconductor Field Effect Transistor) 528. The source of the biasing PMOSFET 528 is coupled to the supply voltage $V_{cc}$, and the gate of the biasing PMOSFET 528 is coupled to the gates of the first PMOSFET 510 and the second PMOSFET 512 of the self-biased PTAT current generator 502.

By current conservation at the collector of the voltage detector BJT 520, the following current relationship results:

$$I_2 = I_1 + I_3 \quad (10)$$

with $I_2$ being the current flowing through the first voltage detector resistor 522, $I_1$ being the current flowing through the voltage detector BJT 520, and $I_3$ being the current flowing through the second voltage detector resistor 524. If the voltage at the collector of the voltage detector BJT 520 is "V," then the following current relationship results:

$$I_2 = [V_{cc} - V]/R_2 \quad (11)$$
$$I_3 = V/R_3 \quad (12)$$

In addition, because of the self-biasing current generator action whereby the base of the voltage detector BJT 520 is coupled to the bases of the first current generator BJT 514 and the second current generator BJT 516 of the self-biased PTAT current generator 502, the following current relationship results:

$$I_1 = I_{PTAT} = \frac{kT \ln(A)}{qR_1} \quad (13)$$

Substituting Equations (11), (12), and (13) into Equation (10), the following relationships result:

$$[V_{cc} - V]/R_2 = [1/q]*[k*T*\ln(A)]/R_1 + V/R_3 \quad (14)$$
$$V_{cc} = V*[1 + R_2/R_3] + [1/q]*[k*T*\ln(A)]*[R_2/R_1] \quad (15)$$

As shown in FIG. 4, the PORST pulse is generated when the supply voltage $V_{cc}$ is in the range of $V_{cc}^\circ$ to $V_{cc}'$. The PORST pulse begins when the supply voltage $V_{cc}$ reaches the lower threshold voltage $V_{cc}^\circ$, and increases linearly with the supply voltage $V_{cc}$ until the supply voltage $V_{cc}$ reaches the upper threshold voltage $V_{cc}'$, the point at which the PORST pulse ends and the output voltage $V_p$ of the power-on reset circuit drops to 0 V.

The PORST pulse is generated at the collector of the inverter BJT 526. When the supply voltage $V_{cc}$ reaches a sufficiently large value such that the voltage V at the base of the inverter BJT 526 reaches the base-emitter turn-on voltage $V_{BE}$(526) of the inverter BJT 526, the voltage V causes the inverter BJT 526 to turn on and to pull the voltage V at the collector of the inverter BJT 526 to the ground voltage. Solving for the value of $V_{cc}'$, the upper threshold voltage, at which V reaches $V_{BE}$(526) by using Equation (15), the following relationship results:

$$V_{cc}' = V_{BE}(526)*[1 + R_2/R_3] + [1/q]*[k*T*\ln(A)]*[R_2/R_1] \quad (16)$$

In this manner, the upper threshold voltage $V_{cc}'$ of the power-on reset pulse generated by the power-on reset circuit 500 of FIG. 5 is proportional to the absolute temperature T at the self-biased PTAT current generator 502 and proportional to the base to emitter voltage $V_{BE}$(526) of the inverter BJT 526. With such a relationship to the temperature T, the upper threshold voltage $V_{cc}'$ of the power-on reset pulse may be optimized to be insensitive to the absolute temperature T by proper design of the resistance values $R_2$ and $R_1$ and of the size factor A such that the partial derivative of the upper threshold voltage $V_{cc}'$ with respect to the temperature is substantially equal to zero.

Comparing Equation (16) to Equation (6) which states the upper threshold voltage $V_{cc}'$ of the power-on reset pulse generated by the power-on reset circuit of FIG. 3, the upper threshold voltage $V_{cc}'$ of the power-on reset pulse generated by the power-on reset circuit 500 of FIG. 5 lacks the $\Delta'$ term. Thus, the upper threshold voltage $V_{cc}'$ of the power-on reset pulse generated by the power-on reset circuit 500 of FIG. 5 is independent of a voltage across a drain and source of any MOSFET (Metal Oxide Semiconductor Field Effect Transistor) within the power-on reset circuit 500 of FIG. 5. The lack of the $\Delta'$ term with the power-on reset circuit topology of FIG. 5 results in further independence of the upper threshold voltage $V_{cc}'$ from variations in temperature and integrated circuit fabrication process parameters. In addition, comparing Equation (16) to Equation (6), the $V_{BE}(526)*[1+R_2/R_3]$ term in Equation (16) replaces the $2*V_{BE}$ term in Equation (6). The $V_{BE}(526)*[1+R_2/R_3]$ term in Equation (16) provides more flexibility since proper resistance values of $R_2$ and $R_3$ may be chosen to ensure further insensitivity to variations in temperature and integrated circuit fabrication processes.

In this manner, the power-on reset circuit 500 of FIG. 5 generates a more controlled upper threshold voltage $V_{cc}'$ of a power-on reset pulse that is more accurate since the upper threshold voltage $V_{cc}'$ generated by the power-on reset circuit 500 of FIG. 5 may be designed to be further insensitive to variations in temperature and integrated circuit fabrication processes.

Referring to FIG. 5, the CMOS buffer 508 of FIG. 5 is similar to the CMOS buffer 10 of FIG. 3. The CMOS buffer 508 includes a first CMOS inverter having a first inverter input 530 coupled to the collector of the inverter BJT 526 and a first inverter output 532. The first CMOS inverter is comprised of a PMOSFET (P-channel Metal Oxide Semiconductor Field Effect Transistor) 534 and an NMOSFET (N-channel Metal Oxide Semiconductor Field Effect Transistor) 536, as known to one of ordinary skill in the art of electronics. The size and biasing of the PMOSFET 534 and the NMOSFET 536 of the first inverter of the CMOS buffer 508 may be designed such that the voltage swing at the first inverter output 532 is greater than the voltage swing at the collector of the inverter BJT 526.

The CMOS buffer 508 includes a second CMOS inverter having a second inverter input 538 coupled to the first inverter output 532 and having a second inverter output 540 that provides the power-on reset pulse coupled to an application circuit that is being reset with the power-on reset pulse. The second CMOS inverter is also comprised of a PMOSFET (P-channel Metal Oxide Semiconductor Field Effect Transistor) 542 and an NMOSFET (N-channel Metal Oxide Semiconductor Field Effect Transistor) 544, as known to one of ordinary skill in the art of electronics. The size and biasing of the PMOSFET 542 and the NMOSFET 544 of the second inverter of the CMOS buffer 508 may be designed such that the second inverter output 540 has higher current drive than the current drive available at the first inverter output 532.

The present invention has been described with respect to particular embodiments thereof, and numerous modifications can be made which are within the scope of the invention as set forth in the claims. The foregoing is by way of example only and is not intended to be limiting. The present invention is limited only as defined in the following claims and equivalents thereof.

I claim:

1. A power-on reset circuit for generating a power-on reset pulse that linearly ramps up from a predetermined lower threshold voltage $V_{cc}°$ to a predetermined upper threshold voltage $V_{cc}'$ when a supply voltage $V_{cc}$ that ramps up from said predetermined lower threshold voltage $V_{cc}°$ to said predetermined upper threshold voltage $V_{cc}'$ is applied to said power on-reset circuit, said power-on reset circuit comprising:

a self-biased current generator that generates a current, which is proportional to a temperature at which said power-on reset circuit is operating, when said supply voltage is applied on said self-biased current generator, said self-biased current generator further comprising;

a first current generator BJT (Bipolar Junction Transistor) and a second current generator BJT (Bipolar Junction Transistor) being coupled to each other as a current-mirror with an emitter of said second current generator BJT being coupled to ground via a current generator resistor;

wherein said first current generator BJT has a first emitter area, and wherein said second current generator BJT has a second emitter area, and wherein A is a size factor of a ratio of said second emitter area to said first emitter area;

and wherein said current generated by said self-biased current generator is a current flowing through said second current generator BJT with a current level substantially equal to $[k*T*\ln(A)]/[q*R_1]$, wherein q is the electronic charge, k is Boltzmann's constant, T is said temperature at which said power-on reset circuit is operating, and $R_1$ is a resistance value of said current generator resistor;

a base-emitter voltage detector further including:

a voltage detector BJT (Bipolar Junction Transistor) having a base coupled to a base of said second current generator BJT of said self-biased current generator such that a current flowing though said voltage detector BJT is substantially equal to said current generated by said self-biased current generator;

a first voltage detector resistor coupled between a collector of said voltage detector BJT and said supply voltage, wherein said first voltage detector resistor has a resistance value of $R_2$; and a second voltage detector resistor coupled between said collector of said voltage detector BJT and ground, wherein said second voltage detector resistor has a resistance value of $R_3$; and a bipolar complementary metal oxide semiconductor (BiCMOS) inverter including an inverter BJT (Bipolar Junction Transistor) having a base coupled to said collector of said voltage detector BJT, and said inverter BJT having a collector that generates said power-on reset pulse as said supply voltage is turned on, and said inverter BJT having an emitter coupled to said ground;

wherein said inverter BJT stays turned off as said power-on reset pulse at said collector of said inverter BJT linearly ramps up from said predetermined lower threshold voltage $V_{cc}°$ to said predetermined upper threshold voltage $V_{cc}'$;

and wherein said inverter BJT turns on when said power-on reset pulse reaches said predetermined upper threshold voltage $V_{cc}$' such that said collector of said inverter BJT is coupled to said ground;

and wherein said predetermined upper threshold voltage Vcc' is substantially equal to $V_{BE}*[1+R_2/R_3]+[R_2/R_1]*[k*T*\ln(A)]*[1/q]$, wherein $V_{BE}$ is a base to emitter voltage ($V_{BE}$) of said inverter BJT when said inverter BJT is turned on, and wherein $R_2$ is said resistance value of said first voltage detector resistor, and wherein $R_3$ is said resistance value of said second voltage detector resistor.

2. The power-on reset circuit of claim 1, wherein said predetermined upper threshold voltage of said power-on reset pulse is optimized to be insensitive to said temperature of operation of said power-on reset circuit by setting the resistance values $R_2$ and $R_1$ and the size factor A such that the partial derivative of said predetermined upper threshold voltage $V_{cc}$' with respect to said temperature T ($\partial V_{cc}'/\partial T$) is substantially equal to zero.

3. The power-on reset circuit of claim 1, further comprising:
   a CMOS buffer coupled between said collector of said inverter BJT and an application circuit for providing a high impedance at said collector of said inverter BJT when said application circuit is coupled to said collector of said inverter BJT via said CMOS buffer such that said power on reset pulse is applied to said application circuit.

4. The power-on reset circuit of claim 3, wherein said CMOS buffer further includes:
   a first CMOS inverter having a first inverter input coupled to said collector of said inverter BJT and having a first inverter output, wherein said first inverter output has an increased voltage swing from a voltage swing at said collector of said inverter BJT; and
   a second CMOS inverter having a second inverter input coupled to said first inverter output of said first CMOS inverter and having a second inverter output, wherein said second inverter output has a higher current drive than a current drive at said first inverter output;
   and wherein said power-on reset pulse is provided to said application circuit from said second inverter output.

5. The power-on reset circuit of claim 1, wherein said self-biased current generator further includes:
   a first PMOSFET (P-channel Metal Oxide Semiconductor Field Effect Transistor) comprising a source, a drain, and a gate, said source of said first PMOSFET being coupled to said supply voltage; and
   a second PMOSFET (P-channel Metal Oxide Semiconductor Field Effect Transistor) comprising a source, a drain, and a gate, said source of said second PMOSFET transistor being coupled to said supply voltage, and said gate of said second PMOSFET being coupled to said drain of said second PMOSFET and to said gate of said first PMOSFET;
   wherein said first current generator BJT (Bipolar Junction Transistor) comprises an emitter, a collector, and a base, said emitter of said first current generator BJT being coupled to ground, and said collector of said first current generator BJT being coupled to said base of said first current generator BJT and to said drain of said first PMOSFET;
   and wherein said second current generator BJT (Bipolar Junction Transistor) comprises an emitter, a collector, and a base, said collector of said second current generator BJT being coupled to said drain of said second PMOSFET, and said base of said second current generator BJT being coupled to said base of said first current generator BJT.

6. A power-on reset circuit for generating a power-on reset pulse that linearly ramps up from a predetermined lower threshold voltage $V_{cc}°$ to a predetermined upper threshold voltage $V_{cc}$' when a supply voltage $V_{cc}$ that ramps up from said predetermined lower threshold voltage $V_{cc}°$ to said predetermined upper threshold voltage $V_{cc}$' is applied to said power on-reset circuit, said power-on reset circuit comprising:
   a self-biased current generator that generates a current, which is proportional to a temperature at which said power-on reset circuit is operating, when said supply voltage is applied on said self-biased current generator, said self-biased current generator further including:
      a first PMOSFET (P-channel Metal Oxide Semiconductor Field Effect Transistor) comprising a source, a drain, and a gate, said source of said first PMOSFET being coupled to said supply voltage;
      a second PMOSFET (P-channel Metal Oxide Semiconductor Field Effect Transistor) comprising a source, a drain, and a gate, said source of said second PMOSFET transistor being coupled to said supply voltage, and said gate of said second PMOSFET being coupled to said drain of said second PMOSFET and to said gate of said first PMOSFET;
      a first current generator BJT (Bipolar Junction Transistor) comprising an emitter, a collector, and a base, said emitter of said first current generator BJT being coupled to ground, and said collector of said first current generator BJT being coupled to said base of said first current generator BJT and to said drain of said first PMOSFET; and
      a second current generator BJT (Bipolar Junction Transistor) comprising an emitter, a collector, and a base, said collector of said second current generator BJT being coupled to said drain of said second PMOSFET, said base of said second current generator BJT being coupled to said base of said first current generator BJT, and said emitter of said second current generator BJT being coupled to ground via a current generator resistor;
      and wherein said first current generator BJT has a first emitter area, and wherein said second current generator BJT has a second emitter area, and wherein A is a ratio of said second emitter area to said first emitter area;
      and wherein said current generated by said self-biased current generator is a current flowing through said second current generator BJT with a current level substantially equal to $[k*T*\ln(A)]/[q*R_1]$, wherein q is the electronic charge, k is Boltzmann's constant, T is said temperature at which said power-on reset circuit operates, and $R_1$ is a resistance value of said current generator resistor;
   a base-emitter voltage detector further including:
      a voltage detector BJT (Bipolar Junction Transistor) having a base coupled to said base of said second current generator BJT of said self-biased current generator such that a current flowing though said voltage detector BJT is substantially equal to said current generated by said self-biased current generator;
      a first voltage detector resistor coupled between a collector of said voltage detector BJT and said supply voltage, wherein said first voltage detector resistor has a resistance value of $R_2$; and a second voltage detector resistor coupled between said collector of said voltage detector BJT and ground, wherein said second voltage detector resistor has a resistance value of $R_3$; and a bipolar complementary metal oxide semiconductor (BiCMOS) inverter including an inverter BJT (Bipolar Junction Transistor) having a base coupled to said collector of said voltage detector BJT, and said inverter BJT having a collector that generates said power-on reset pulse as said supply voltage is turned on, and said inverter BJT having an emitter coupled to said ground;

wherein said inverter BJT stays turned off as said power-on reset pulse at said collector of said inverter BJT linearly ramps up from said predetermined lower threshold voltage $V_{cc}^{\circ}$ to said predetermined upper threshold voltage $V_{cc}'$;

and wherein said inverter BJT turns on when said power-on reset pulse reaches said predetermined upper threshold voltage $V_{cc}'$ such that said collector of said inverter BJT is coupled to said ground;

and wherein said predetermined upper threshold voltage, $V_{cc}'$, of said power-on reset pulse, is substantially equal to $V_{BE}*[1+R_2/R_3]+[R_2/R_1]*[k*T*\ln(A)]*[1/q]$, wherein $V_{BE}$ is a base to emitter voltage ($V_{BE}$) of said inverter BJT when said inverter BJT is turned on, and wherein $R_2$ is said resistance value of said first voltage detector resistor, and wherein $R_3$ is said resistance value of said second voltage detector resistor;

and wherein said predetermined upper threshold voltage of said power-on reset pulse is optimized to be insensitive to said temperature by setting the resistance values $R_2$ and $R_1$ and the size factor A such that the partial derivative of the predetermined upper threshold voltage $V_{cc}'$ with respect to said temperature T ($\partial V_{cc}'/\partial T$) is substantially equal to zero;

a CMOS buffer coupled between said collector of said inverter BJT and an application circuit for providing a high impedance at said collector of said inverter BJT when said application circuit is coupled to said collector of said inverter BJT via said CMOS buffer such that said power on reset pulse is applied to said application circuit, said CMOS buffer further including:

a first CMOS inverter having a first inverter input coupled to said collector of said inverter BJT and having a first inverter output, wherein said first inverter output has an increased voltage swing from a voltage swing at said collector of said inverter BJT; and a second CMOS inverter having a second inverter input coupled to said first inverter output of said first CMOS inverter and having a second inverter output, wherein said second inverter output has a higher current drive than a current drive at said first inverter output;

and wherein said power-on reset pulse is provided to said application circuit from said second inverter output.

* * * * *